(12) United States Patent
Herner

(10) Patent No.: US 7,834,338 B2
(45) Date of Patent: Nov. 16, 2010

(54) MEMORY CELL COMPRISING NICKEL-COBALT OXIDE SWITCHING ELEMENT

(75) Inventor: S. Brad Herner, San Jose, CA (US)

(73) Assignee: SanDisk 3D LLC, Milpitas, CA (US)

( * ) Notice: Subject to any disclaimer, the term of this patent is extended or adjusted under 35 U.S.C. 154(b) by 245 days.

(21) Appl. No.: 11/440,899

(22) Filed: May 24, 2006

(65) Prior Publication Data

US 2007/0114509 A1 May 24, 2007

Related U.S. Application Data

(63) Continuation-in-part of application No. 11/287,452, filed on Nov. 23, 2005.

(51) Int. Cl.
*H01L 29/02* (2006.01)
(52) U.S. Cl. .......... 257/2; 257/3; 257/4; 257/5; 257/E29.002; 438/102; 365/163
(58) Field of Classification Search .......... 257/1–5, 257/E29.002; 438/800, 900, 102–103; 365/163
See application file for complete search history.

(56) References Cited

U.S. PATENT DOCUMENTS

| | | | |
|---|---|---|---|
| 2,655,609 A | 10/1953 | Shockley | |
| 2,971,140 A | 12/1959 | Chappey et al. | |
| 3,796,926 A | 3/1974 | Cole et al. | |
| 4,204,028 A * | 5/1980 | Donley | 428/432 |
| 4,499,557 A | 2/1985 | Holmberg et al. | |
| 4,646,266 A | 2/1987 | Ovshinsky et al. | |
| 4,772,571 A | 9/1988 | Scovell et al. | |
| 4,907,054 A | 3/1990 | Berger | |
| 4,940,553 A | 7/1990 | von Benda | |
| 5,037,200 A | 8/1991 | Kodama | |
| 5,166,758 A | 11/1992 | Ovshinsky et al. | |
| 5,273,915 A * | 12/1993 | Hwang et al. | 438/155 |
| 5,311,055 A | 5/1994 | Goodman et al. | |
| 5,774,394 A * | 6/1998 | Chen et al. | 365/158 |
| 5,854,102 A | 12/1998 | Gonzalez et al. | |

(Continued)

FOREIGN PATENT DOCUMENTS

EP 1 308 960 A2 5/2003

(Continued)

OTHER PUBLICATIONS

Scheurlein, 2000 Proc. of Int Solid-State Circuits Conf. P128.*

(Continued)

*Primary Examiner*—Bradley K Smith
*Assistant Examiner*—Jami M Valentine
(74) *Attorney, Agent, or Firm*—Dugan & Dugan, P.C.

(57) ABSTRACT

Oxides of both nickel and cobalt have lower resistivity than either nickel oxide or cobalt oxide. Nickel oxide and cobalt oxide can be reversibly switched between two or more stable resistivity states by application of suitable electrical pulses. It is expected that oxides including both nickel and cobalt, or $(Ni_xCo_y)O$, will switch between resistivity states at lower voltage and/or current than will nickel oxide or cobalt oxide. A layer of $(Ni_xCo_y)O$ can be paired with a diode or transistor to form a nonvolatile memory cell.

45 Claims, 6 Drawing Sheets

U.S. PATENT DOCUMENTS

| | | | |
|---|---|---|---|
| 5,876,788 A | 3/1999 | Bronner et al. | |
| 5,915,167 A | 6/1999 | Leedy | |
| 6,034,882 A | 3/2000 | Johnson et al. | |
| RE37,259 E | 7/2001 | Ovshinsky | |
| 6,369,431 B1 | 4/2002 | Gonzalez et al. | |
| 6,426,891 B1 | 7/2002 | Katori | |
| 6,465,370 B1 | 10/2002 | Schrems | |
| 6,483,734 B1 | 11/2002 | Sharma et al. | |
| 6,534,841 B1 | 3/2003 | Van Brocklin et al. | |
| 6,541,792 B1 | 4/2003 | Tran et al. | |
| 6,707,698 B2 | 3/2004 | Fricke et al. | |
| 6,753,561 B1 | 6/2004 | Rinerson et al. | |
| 6,761,985 B2 | 7/2004 | Windisch et al. | |
| 6,774,458 B2 | 8/2004 | Fricke et al. | |
| 6,778,441 B2 | 8/2004 | Forbes et al. | 365/185.26 |
| 6,787,401 B2 | 9/2004 | Gonzalez et al. | |
| 6,798,685 B2 | 9/2004 | Rinerson et al. | |
| 6,815,744 B1 | 11/2004 | Beck et al. | 257/295 |
| 6,831,854 B2 | 12/2004 | Rinerson et al. | |
| 6,834,008 B2 | 12/2004 | Rinerson et al. | |
| 6,836,421 B2 | 12/2004 | Rinerson et al. | |
| 6,850,429 B2 | 2/2005 | Rinerson et al. | |
| 6,850,455 B2 | 2/2005 | Rinerson et al. | |
| 6,856,536 B2 | 2/2005 | Rinerson et al. | |
| 6,859,382 B2 | 2/2005 | Rinerson et al. | |
| 6,870,755 B2 | 3/2005 | Rinerson et al. | |
| 6,946,719 B2 | 9/2005 | Petti et al. | |
| 6,952,030 B2 | 10/2005 | Herner et al. | |
| 7,116,573 B2 | 10/2006 | Sakamoto et al. | |
| 7,172,840 B2 | 2/2007 | Chen et al. | |
| 7,176,064 B2 | 2/2007 | Herner et al. | |
| 7,215,564 B2 | 5/2007 | Happ et al. | |
| 7,224,013 B2 | 5/2007 | Herner et al. | |
| 7,238,607 B2 | 7/2007 | Dunton et al. | |
| 7,265,049 B2 | 9/2007 | Herner et al. | |
| 7,307,013 B2 | 12/2007 | Raghuram et al. | |
| 7,307,268 B2 | 12/2007 | Scheuerlein | |
| 7,391,064 B1 | 6/2008 | Tripsas et al. | |
| 7,501,331 B2 | 3/2009 | Herner | |
| 2002/0057594 A1* | 5/2002 | Hirai | 365/171 |
| 2003/0013007 A1 | 1/2003 | Kaun | |
| 2004/0084743 A1 | 5/2004 | Vanbuskirk et al. | |
| 2004/0095300 A1* | 5/2004 | So et al. | 345/82 |
| 2004/0159828 A1 | 8/2004 | Rinerson et al. | |
| 2004/0159867 A1 | 8/2004 | Kinney et al. | |
| 2004/0159869 A1 | 8/2004 | Rinerson et al. | |
| 2004/0160798 A1 | 8/2004 | Rinerson et al. | |
| 2004/0160804 A1 | 8/2004 | Rinerson et al. | |
| 2004/0160805 A1 | 8/2004 | Rinerson et al. | |
| 2004/0160806 A1 | 8/2004 | Rinerson et al. | |
| 2004/0160807 A1 | 8/2004 | Rinerson et al. | |
| 2004/0160808 A1 | 8/2004 | Rinerson et al. | |
| 2004/0160812 A1 | 8/2004 | Rinerson et al. | |
| 2004/0160817 A1 | 8/2004 | Rinerson et al. | |
| 2004/0160818 A1 | 8/2004 | Rinerson et al. | |
| 2004/0160819 A1 | 8/2004 | Rinerson et al. | |
| 2004/0161888 A1 | 8/2004 | Rinerson et al. | |
| 2004/0170040 A1 | 9/2004 | Rinerson et al. | |
| 2004/0228172 A1 | 11/2004 | Rinerson et al. | |
| 2004/0245557 A1 | 12/2004 | Seo et al. | |
| 2005/0045919 A1 | 3/2005 | Kaeriyama et al. | |
| 2005/0052915 A1 | 3/2005 | Herner et al. | |
| 2005/0058009 A1 | 3/2005 | Yang | |
| 2005/0167699 A1 | 8/2005 | Sugita | |
| 2005/0221200 A1 | 10/2005 | Chen et al. | |
| 2005/0226067 A1 | 10/2005 | Herner | |
| 2005/0247921 A1 | 11/2005 | Lee et al. | |
| 2005/0286211 A1 | 12/2005 | Pinnow et al. | |
| 2006/0006495 A1 | 1/2006 | Herner et al. | |
| 2006/0067117 A1 | 3/2006 | Petti | |
| 2006/0094236 A1 | 5/2006 | Elkins | |
| 2006/0098472 A1 | 5/2006 | Ahn et al. | |
| 2006/0128153 A1 | 6/2006 | Dunton et al. | |
| 2006/0157679 A1 | 7/2006 | Scheuerlein | |
| 2006/0164880 A1 | 7/2006 | Sakamoto et al. | |
| 2006/0250836 A1 | 11/2006 | Herner et al. | |
| 2006/0250837 A1 | 11/2006 | Herner et al. | |
| 2006/0268594 A1 | 11/2006 | Toda | |
| 2006/0273298 A1 | 12/2006 | Petti | |
| 2007/0010100 A1 | 1/2007 | Raghuram et al. | |
| 2007/0072360 A1 | 3/2007 | Kumar et al. | |
| 2007/0102724 A1 | 5/2007 | Kumar et al. | |
| 2007/0228354 A1 | 10/2007 | Scheuerlein | |
| 2007/0228414 A1 | 10/2007 | Kumar | |
| 2007/0236981 A1 | 10/2007 | Herner | |
| 2007/0246743 A1 | 10/2007 | Cho et al. | |
| 2008/0175032 A1 | 7/2008 | Tanaka et al. | |
| 2009/0001342 A1 | 1/2009 | Schricker et al. | |
| 2009/0001343 A1 | 1/2009 | Schricker et al. | |
| 2009/0001344 A1 | 1/2009 | Schricker et al. | |
| 2009/0001345 A1 | 1/2009 | Schricker et al. | |
| 2009/0104756 A1 | 4/2009 | Kumar | |
| 2009/0236581 A1 | 9/2009 | Yoshida et al. | |

FOREIGN PATENT DOCUMENTS

| | | |
|---|---|---|
| EP | 1484799 | 12/2004 |
| EP | 1 513 159 A2 | 3/2005 |
| EP | 1 914 806 A1 | 4/2008 |
| GB | 1 284 645 | 8/1972 |
| GB | 1 416 644 | 12/1975 |
| GB | 1416644 | 12/1975 |
| JP | 62042582 | 2/1987 |
| WO | WO 97/41606 | 11/1997 |
| WO | 0049659 | 8/2000 |
| WO | WO 01/69655 A2 | 9/2001 |
| WO | WO 03/079463 A2 | 9/2003 |
| WO | WO 2004/084229 A1 | 9/2004 |
| WO | WO 2005/008783 A1 | 1/2005 |
| WO | WO 2005/024839 A1 | 3/2005 |
| WO | WO 2006/078505 A2 | 7/2006 |
| WO | WO 2006/121837 A2 | 11/2006 |
| WO | WO 2006/121837 A3 | 11/2006 |
| WO | WO 2007/004843 A1 | 1/2007 |
| WO | WO 2007/038709 | 4/2007 |
| WO | WO 2007/062022 A1 | 5/2007 |
| WO | WO 2007/067448 A1 | 6/2007 |
| WO | WO 2007/072308 A1 | 6/2007 |
| WO | WO 2008/097742 A1 | 8/2008 |

OTHER PUBLICATIONS

Bruyere et al., "Switching and Negative Resistance in Thin Films of Nickel Oxide", (Applied Physics Letters, vol. 16, No. 1, Jan. 1, 1970,).*

Baek et al. ("Highly Scalable Non-volatile Resistive Memory using Simple Binary Oxide Driven by Asymmetric Unipolar Voltage Pulses," IEEE International Electron Devices Meeting, IEEE 2004, published Dec. 13-15, 2004).*

Roginskaya et al., "Characterization of Bulk and Surface Composition of CoxNi1-xOy Mixed Oxides for Electrocatalysis", Langmuir 1997, vol. 13, pp. 4621-4627.

Bruyere et al., "Switching and Negative Resistance in Thin Films of Nickel Oxide", Applied Physics Letters, vol. 16, No. 1, Jan. 1, 1970, pp. 40-43.

Windisch, et al., "Synthesis and characterization of transparent conducting oxide cobalt-nickel spinel films," Journal of Vacuum Science & Technology A, vol. 19, No. 4, Jul. 2001 pp. 1647-1651.

Fuschillo, et al., "Non-Linear Transport and Switching Properties of Transition Metal Oxides," 6th International Vacuum Congress, Kyoto Japan, Mar. 25-29, 1974, Japanese Journal of Applied Physics Suppl., vol. 2, No. 1, 1974, pp. 817-820, XP002429046, ISSN: 0021-4922.

Beck, et al., "Reproducible Switching Effect in Thin Oxide Films for Memory Applications," Applied Physics Letters, vol. 77, No. 1, Jul. 3, 2000, pp. 139-141, XP00958527, ISSN: 0003-6951.

Baek, I.G. ,"Highly Scalable Non-volatile Resistive Memory Using Simple Binary Oxide Driven by Asymmetric Unipolar Voltage Pulses", *IEDM* (2004), (Jan. 2004),587-590.

Pagnia, H.,et al. ,"Bistable Switching in Electroformed Metal-Insulator-Metal Devices", *Phys. Stat. Sol.*, A 108,(1998),11.

Park, Jae-Wan.,"Reproducible resistive switching in nonstoichiometric nickel oxide films grown by rf reactive sputtering for resistive random access memory applications", *J. Vac. Sci. Technol. A* 23(5), (Sep./Oct. 2005),1309-1313.

Seo, S.,"Conductivity switching characteristics and reset currents in NiO films", *Appl. Phys. Lett.* 86, 093509 (2005), (2005),093509;093509-2;093509-3.

Seo, S.,"Reproducible resistance switching in polycrystalline NiO films", *Appl. Phys. Lett.* vol. 85, No. 23 (2004), (Dec. 6, 2004),5655-5657.

Sim, H.,"Resistance-switching characteristics of polycrystalline Nb2O5 for nonvolatile memory application", *IEEE Electron Device Letters* 26 292 (2005),1-3.

Windisch, Charles.F. ,et al. ,"Synthesis and charaterization of transparent conducting oxide cobalt-nickel spinal films", *J. Vac. Sci. Tech.*, A 19,(2001),1647-1651.

Baek et al., "Multi-layer Cross-point Binary Oxide Resistive Memory (OxRRAM) for Post-NAND Storage Application," 2005, pp. 1-4, IEEE.

Hiatt et al., "Bistable Switching in Niobium Oxide Diodes," Applied Physics Letters, Mar. 15, 1965, vol. 6, No. 6, pp. 106-108.

Hwang et al., "Molecular dynamics simulations of nanomemory element based on boron-nitride nanotube-to-peapod transition," Computational Materials Science, 2005, pp. 317-324, 33, Elsevier B.V.

Mine, Lili, "ReRAM with Erase/Read Speed of 3ns, Applicable as Multi-Level cell", Dec. 26, 2006. Nikkei Electronics, <http://techon.nikkeibp.co.jp/english/NEWS_EN/20061226/12591&f>; pp. 1-2.

Prince, "Trends in Scaled and Nanotechnology Memories," Sep. 2005, Non-Volatile Memory Symposium, IEEE, Piscataway, NJ USA, pp. 55-61.

May 9, 2007 International Search Report of International Application No. PCT/US2006/045034.

May 9, 2007 Written Opinion of International Application No. PCT/US2006/045034.

Jun. 5, 2008 International Preliminary Report on Patentability of International Application No. PCT/US2006/045034.

Sep. 18, 2008 Office Action of European Application No. 06 838 165.6.

Apr. 12, 2007 International Search Report and Written Opinion of International Application No. PCT/US2006/045017.

May 15, 2007 Office Action of U.S. Appl. No. 11/287,452.

Jun. 26, 2008 Office Action of U.S. Appl. No. 11/287,452.

Dec. 26, 2007 Final Office Action of U.S. Appl. No. 11/287,452.

Jun. 5, 2008 International Preliminary Report on Patentability and Written Opinion of International Application No. PCT/US2006/045017.

Malhi et al., "Characteristics and Three-Dimensional Integration of MOSFET's in Small-Grain LPCVD Polycrystalline Silicon", Feb. 1985, IEEE Journal of Solid-State Circuits, vol. sc-20, No. 1, pp. 178-201.

Choi et al., "Resistive Switching Mechanism of TiO2 Thin Films Grown by Atomic-Layer Deposition", 2005, Journal of Applied Physics 98, pp. 033715-1-033715-10.

Shih et al., "Study of Anodic Oxidation of Aluminum in Mixed Acid using a Pulsed Current", 2000, Surface and Coatings Technology 124, pp. 278-285.

F C Eze, "Electroless Depositioni of CoO Thin Films", J. Phys. D: Appl. Phys. 32 (1999), pp. 533-540.

Milgram, "Selective Surfaces of Anodic Copper Oxide for Solar Collectors" Jun. 1983, J. Appl. Phys. 54 (6), pp. 3640-3642.

Lu et al., "Study of the Electroless Deposition Process of Ni-P-Based Ternary Alloys", 2003, Journal of the Electrochemical Society, 150 (11), pp. C777-C786.

Osaka et al., "Electroless Nickel Ternary Alloy Deposition on SiO2 for Application to Diffusion Barrier Layer in Copper Interconnect Technology", 2002, Journal of the Electrochemical Society, 149 (11), pp. C573-C578.

Han et al., "The Growth Mechanism of Nickel Oxide Thin Films by Room-Temperature Chemical Bath Deposition", 2006, Journal of The Electrochemical Society, 153 (6), pp. C382-C386.

G.P. Burns, "Titanium Dioxide Dielectric Films Formed by Rapid Thermal Oxidation", Mar. 1, 1989, J. Appl. Phys. 65 (5), pp. 2095-2097.

Fujimoto et al., "TiO2 Anatase Nanolayer on TiN Thin Film Exhibiting High-Speed Bipolar Resistive Switching", 2006, Applied Physics Letters 89, pp. 223509-1-223509-3.

Takano et al., "Mechanism of the Chemical Deposition of Nickel on Silicon Wafers in Aqueous Solution", 1999, Journal of the Electrochemical Society, 146 (4), pp. 1407-1411.

Abouatallah et al., "Characterization of Vanadium Deposit Formation at a Hydrogen Evolving Electrode in Alkaline Media", 2001, Journal of the Electrochemical Society, 148 (9), pp. E357-E363.

Christensen et al., "The Influence of Oxide on the Electrodeposition of Niobium from Alkali Fluoride Melts", May 1994, J. Electrochem. Soc., vol. 141, No. 5, pp. 1212-1220.

Lantelme et al., "Electrodeposition of Tantalum in NaCl-KCl-K2TzF7 Melts", May 1992, J. Electrochem. Soc., vol. 139, No. 5, pp. 1249-1255.

Herner et. al., "Vertical p-i-n Polysilicon Diode With Antifuse for Stackable Field-Programmable ROM", May 2004, IEEE Electron Device Letters, vol. 25, No. 5, pp. 271-273.

Mar. 10, 2009 Office Action and Search Report of ROC (Taiwan) Patent Application No. 095143253.

Nov. 15, 2007 Reply to May 15, 2007 Office Action of U.S. Appl. No. 11/287,452.

May 27, 2008 Reply to Dec. 26, 2007 Final Office Action of U.S. Appl. No. 11/287,452.

Oct. 27, 2008 Reply to Jun. 26, 2008 Office Action of U.S. Appl. No. 11/287,452.

May 14, 2009 Notice of Allowance of U.S. Appl. No. 11/287,452.

Jul. 9, 2009 Notice of Allowance of U.S. Appl. No. 11/287,452.

Aug. 4, 2008 Preliminary Amendment of European Patent Application No. 06 838 165.6.

May 8, 2009 Office Action of Chinese Application No. 200680043939.X.

Jun. 8, 2009 Reply to Mar. 10, 2009 Office Action of Taiwan Patent Application No. 095143253.

Jul. 3, 2009 Office Action of China Patent Application No. 200680043951.0.

Jeong et al., "Ultraviolet-enhanced photodiode employing n-ZnO/p-Si structure", Applied Physics Letters, American Institute of Physics, Melville, NY, US, vol. 83, No. 14, Oct. 6, 2003, pp. 2946-2948.

Ozgur et al., "A comprehensive review of ZnO materials and devices", Journal of Applied Physics, American Institute of Physics, New York, US, vol. 98, No. 4, Aug. 30, 2005, pp. 1-103.

Sim et al., "Excellent Resistance Switching Characteristics of Pt/SrTiO3 Schottky Junction for Multi-bit Nonvolatile Memory Application", Electron Devices Meeting, 2005, IEDM Technical Digest, IEEE International Dec. 5, 2005, Piscataway, NJ, USA, pp. 758-761.

Notice of Allowance of U.S. Appl. No. 11/287,452 mailed Nov. 6, 2009.

Ansari, et al., "Pre- and Post-Threshold Conduction Mechanisms in Thermally Grown Titanium Oxide Films", J. Phys. D. Appl. Phys. 20, (1987), pp. 1063-1066.

Oct. 28, 2009 Reply to Office Action of counterpart Chinese Patent Application No. 200680043951.0 dated Jul. 30, 2009.

Sep. 8, 2009 Reply to May 8, 2009 Office Action of related Chinese Application No. 200680043939.X.

Notice of Allowance of related U.S. Appl. No. 11/287,452 mailed Feb. 22, 2010.

Notice of Allowance of related U.S. Appl. No. 11/287,452 mailed Apr. 2, 2010.

Second Office Action of counterpart Chinese Patent Application No. 200680043951.0 dated Apr. 21, 2010.

Jun. 2, 2010 Reply to Apr. 21, 2010 Second Office Action of China Patent Application No. 200680043951.0.

Notice of Allowance of U.S. Appl. No. 11/287,452 mailed Jun. 24, 2010.

\* cited by examiner

US 7,834,338 B2

MEMORY CELL COMPRISING NICKEL-COBALT OXIDE SWITCHING ELEMENT

RELATED APPLICATION

This application is a continuation-in-part of Herner et al., U.S. application Ser. No. 11/287,452, "Reversible Resistivity-Switching Metal Oxide or Nitride Layer with Added Metal," hereinafter the '452 application, which is assigned to the assignee of the present invention and hereby incorporated by reference in its entirety.

BACKGROUND OF THE INVENTION

The invention relates to resistivity-switching metal oxides, specifically nickel oxide and cobalt oxide.

These materials can be reversibly switched between two or more stable resistivity states by application of appropriate electrical bias pulses. These resistivity states can correspond to data states of a nonvolatile memory cell.

Nickel oxide and cobalt oxide may be formed in high-resistivity states. In some embodiments it has been found that the first pulse required to perform the switch from the initial high-resistivity state to a lower-resistivity state can be larger than the pulses required for subsequent switches.

Large-amplitude pulses have many disadvantages. It would be advantageous to avoid the need for a large-amplitude pulse to perform the initial resistivity switch. It would further be advantageous to reduce the current or voltage required for subsequent switches between resistivity states.

SUMMARY OF THE PREFERRED EMBODIMENTS

The present invention is defined by the following claims, and nothing in this section should be taken as a limitation on those claims. In general, the invention is directed to the use of nickel-cobalt oxide as a resistivity-switching material, especially in a memory cell.

A first aspect of the invention provides for a memory cell comprising: a resistance-switching element comprising a layer of $(Ni_xCo_y)O$, wherein $x+y=1$ and neither x nor y is 0.

A preferred embodiment of the invention provides for a first memory level above a substrate comprising: a plurality of first substantially parallel, substantially coplanar conductors extending in a first direction; a plurality of second substantially parallel, substantially coplanar conductors extending in a second direction different from the first direction, the second conductors above the first conductors; a plurality of first pillars, each first pillar vertically disposed between one of the first conductors and one of the second conductors; and a first plurality of memory cells, each first memory cell comprising a portion of one of the first conductors, one of the first pillars, a portion of one of the second conductors, and a resistance-switching element, the resistance-switching element comprising a layer of nickel-cobalt oxide.

Another preferred embodiment of the invention provides for a monolithic three dimensional memory array comprising: a) a first memory level monolithically formed above a substrate, the first memory level comprising a plurality of first memory cells, each first memory cell comprising a layer of resistivity-switching nickel-cobalt oxide; and b) a second memory level monolithically formed above the first memory level.

Another aspect of the invention provides for a method for forming a memory cell, the memory cell comprising a resistance-switching element, the method comprising: forming a steering element; and forming the resistance-switching element, the resistance-switching element comprising a layer of $(Ni_xCo_y)O$, where $x+y=1$ and neither x nor y is 0, wherein the steering element and the resistance-switching element are arranged electrically in series in the memory cell.

Still another preferred embodiment of the invention provides for a method for forming a first memory level above a substrate, the method comprising: forming a plurality of first substantially parallel, substantially coplanar conductors; forming a plurality of first vertically oriented diodes above the first conductors; forming a layer of $(Ni_xCo_y)O$, where $x+y=1$ and neither x nor y is 0, above the first conductors; and forming a plurality of second substantially parallel, substantially coplanar conductors above the first diodes, wherein each diode and the layer of nickel-cobalt oxide are disposed between one of the first conductors and one of the second conductors.

Each of the aspects and embodiments of the invention described herein can be used alone or in combination with one another.

The preferred aspects and embodiments will now be described with reference to the attached drawings.

DETAILED DESCRIPTION OF THE PREFERRED EMBODIMENTS

Figure 1:
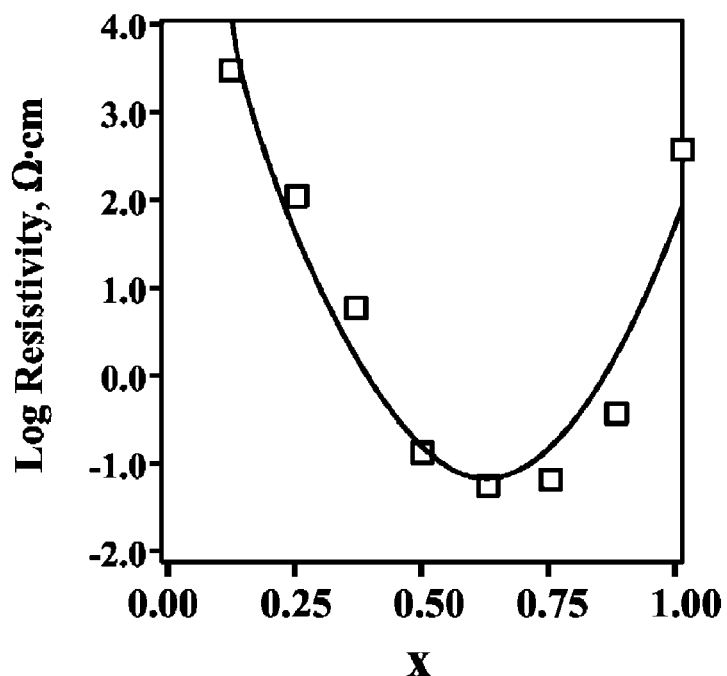
FIG. 1 is a graph illustrating resistivity for a range of nickel-cobal oxides.

As described in Herner et al., U.S. patent application Ser. No. 11/395,995, "Nonvolatile Memory Cell Comprising a Diode and a Resistance-Switching Material," filed Mar. 31, 2006, assigned to the assignee of the present invention and hereby incorporated by reference and hereinafter the '995 application, various binary metal oxides and nitrides, including $Ni_xO_y$, $Nb_xO_y$, $Ti_xO_y$, $Hf_xO_y$, $Al_xO_y$, $Mg_xO_y$, $Co_xO_y$, $Cr_xO_y$, $V_xO_y$, $Zn_xO_y$, $Zr_xO_y$, $B_xN_y$, and $Al_xN_y$ exhibit resistivity-switching properties.

These resistivity-switching metal oxides or nitrides can be reversibly switched between two or more stable higher- and lower-resistivity states by application of suitable electrical pulses. This behavior makes them attractive candidates for use in non-volatile memory cells. The resistivity state of a resistivity-switching metal oxide or nitride element in a memory cell can correspond to a data state; for example a high-resistivity state can correspond to a data '0' while a low-resistivity state corresponds to a data '1', or vice versa. If more than two distinct and stable resistivity states can be achieved, each cell can have more than two data states.

In general, these metal oxides or nitrides are switched from a high-resistivity state or reset state to a low-resistivity set state by application of a set pulse; similarly, the switch from a low-resistivity state to a high resistivity state is induced by application of a reset pulse. This discussion will also speak of set voltage, set current, reset voltage and reset current. The actual switching mechanism is unclear; it may be that the high-to-low resistivity set transition is achieved primarily by current, while the low-to-high resistivity reset transition is achieved by voltage.

In some embodiments, depending on the environment and method of formation, these resistivity-switching metal oxides or nitrides may be formed in an initial high-resistivity state. The transition from the initial high-resistivity state to a lower-resistivity state may require a pulse having a higher amplitude than pulses required to effect subsequent switches. This initial pulse will be called a forming pulse.

It would be advantageous to eliminate or reduce the need for a forming pulse, and to reduce the amplitude of set and reset pulses. In general, lowering voltage and/or current in integrated circuits has several advantages, including reduced power use, improving thermal tolerance, and extending battery life.

In preferred embodiments described in the '995 application, a nonvolatile memory cell comprises a layer of resistivity-switching binary oxide or nitride paired with a diode. Inclusion of a diode in each memory cell provides electrical isolation between memory cells sharing wordlines or bitlines in a dense cross-point memory array. In some embodiments, the set pulse is applied with the diode under forward bias, while the reset pulse is applied with the diode under reverse bias.

Large voltages and currents, particularly under reverse bias, will tend to degrade and eventually destroy the diode. In such a memory cell, eliminating or reducing the forming pulse, and reducing the amplitude of set and reset pulses, affords the additional advantage of improving diode longevity.

Preferred resistivity-switching metal oxides or nitrides are nickel oxide and cobalt oxide. These oxides may be stoichiometric NiO and CoO or non-stoichiometric compounds. Nickel oxide and cobalt oxide have the same crystal structure, and the ionic radii and lattice constants of nickel and cobalt are very similar; as a result these metals can substitute for each other freely in nickel-cobalt oxides.

As described in Windisch et al., "Synthesis and characterization of transparent conducting oxide cobalt-nickel spinel films," J. Vac. Sci. Technol. A 19(4), July/August 2001, mixed oxides of nickel and cobalt are more conductive than pure nickel oxide or cobalt oxide. FIG. 1 is a graph showing resistivity for nickel-cobalt oxides, with the fraction of cobalt increasing from 0.0 to 1.0 across the x-axis. Pure nickel oxide and cobalt oxide, at the far left and far right of the graph, respectively, have the highest resistivities, while oxides of intermediate composition have lower resistivities. The lowest resistivity occurs at about $(Ni_{0.33}Co_{0.67})O$.

In the present invention, it is expected that nickel-cobalt oxides having initial resistivity lower than that of an oxide of nickel or cobalt alone will require a lower forming pulse to effect the first switch to a lower-resistivity state, reducing the need for the large forming pulse. The forming pulse may in fact be eliminated entirely, allowing the initial high-to-low-resistivity switch at the same voltage or current required by later high-to-low resistivity conversions; i.e. the forming pulse is no different from a subsequent set pulse. It is further expected that set and reset pulses will be lower for these nickel-cobalt oxide alloys than for nickel oxide or cobalt oxide.

An oxide of nickel and cobalt as described above will also be referred to herein as $(Ni_xCo_y)O$, where $x+y=1$, and neither x nor y is 0; preferably y (the fraction of cobalt) is between about 0.0001 and 0.9999. Nickel-cobalt oxides having lower resistivity will likely switch at lower voltages and currents, which is advantageous. In a memory cell it is also advantageous for the achievable stable resistivity states, which correspond to data states of the cell, to be readily distinguishable; this is achieved by maximizing the difference between these states. At the low point of the curve of FIG. 1, where y (the fraction of cobalt) is about 0.67, the difference between set and reset states may be smaller than desirable. When the value of y approaches 0.0 or 1.0, at the far left or far right of the graph, the forming value may be undesirably high. Preferred nickel-cobalt oxide alloys for use in a memory cell, then, will avoid both the highest and lowest points of the curve of FIG. 1. The value of y more preferably is either between about 0.05 and about 0.65 or between about 0.70 and about 0.95; and most preferably is either between about 0.10 and about 0.50 or between about 0.75 and about 0.95. A layer of $(Ni_xCo_y)O$ may include a variety of species and phases, including nickel oxide and cobalt oxides; the variables x and y describe the proportion of nickel and cobalt in the layer as a whole.

In preferred embodiments of the present invention a memory cell is formed by pairing a switching element and a steering element, where the switching element comprises a layer of $(Ni_xCo_y)O$ (for brevity, when nickel-cobalt oxide is described as $(Ni_xCo_y)O$ it will be understood in this discussion that $x+y=1$ and neither x nor y is 0) and the steering element is a device with asymmetric conduction characteristics, such as a diode or a transistor.

Figure 2:
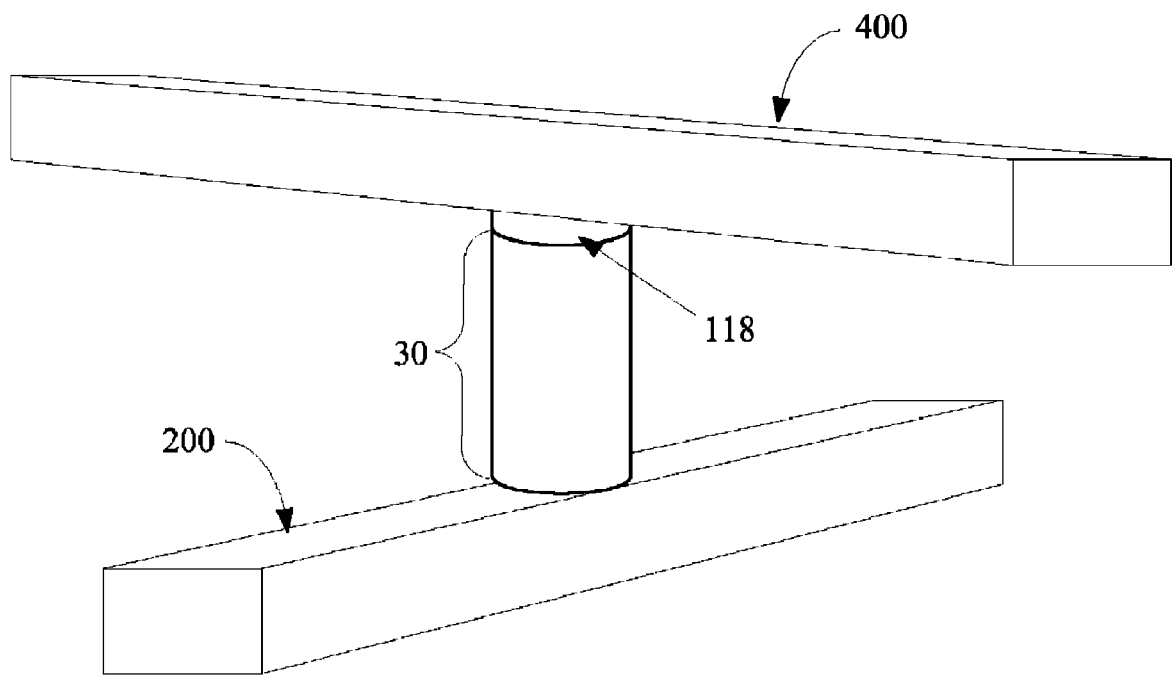
FIG. 2 is a cross-sectional view illustrating a memory cell formed according to a preferred embodiment of the present invention.

FIG. 2 shows a preferred embodiment of the present invention. The cell includes a portion of a bottom conductor 200 and a portion of a top conductor 400. The rail-shaped top and bottom conductors preferably extend in different directions; for example they may be perpendicular. Disposed between the top conductor 400 and bottom conductor 200 are a diode 30 and a resistance-switching element 118 arranged electrically in series. The resistance-switching element 118 comprises a layer of $(Ni_xCo_y)O$ which switches between high- and low-resistivity states upon application of voltage or flow of current between top conductor 400 and bottom conductor 200.

Figure 3:
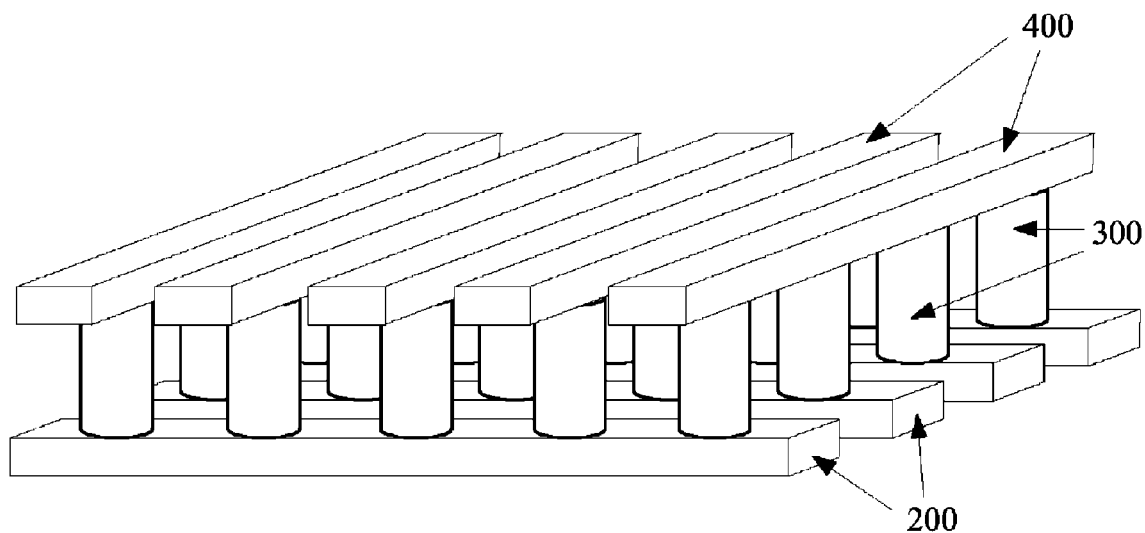
FIG. 3 is a perspective view of a portion of a first memory level comprising memory cells like the memory cell of FIG. 2.

FIG. 3 shows a plurality of bottom conductors 200 and top conductors 400, with intervening pillars 300, the pillars 300 comprising diodes and resistance-switching elements. In an alternative embodiment, the diode could be replaced with some other non-ohmic device. In this way a first level of memory cells can be formed; only a small portion of such a memory level is shown here. In preferred embodiments, additional memory levels can be formed stacked above this first memory level, forming a highly dense monolithic three dimensional memory array. The memory array is formed of deposited and grown layers above a substrate, for example a monocrystalline silicon substrate. Support circuitry is advantageously formed in the substrate below the memory array.

An alternative embodiment of the present invention uses a structure described in Petti et al., U.S. patent application Ser. No. 11/143,269, "Rewriteable Memory Cell Comprising a Transistor and Resistance-Switching Material in Series," filed Jun. 2, 2005, assigned to the assignee of the present invention and hereby incorporated by reference. Petti et al. describe a memory cell having a layer of a resistivity-switching binary metal oxide or nitride formed in series with a MOS transistor. In embodiments of Petti et al., the MOS transistor is a thin-film transistor, having its channel region in deposited semiconductor material rather than in a monocrystalline wafer substrate.

Figure 4A:
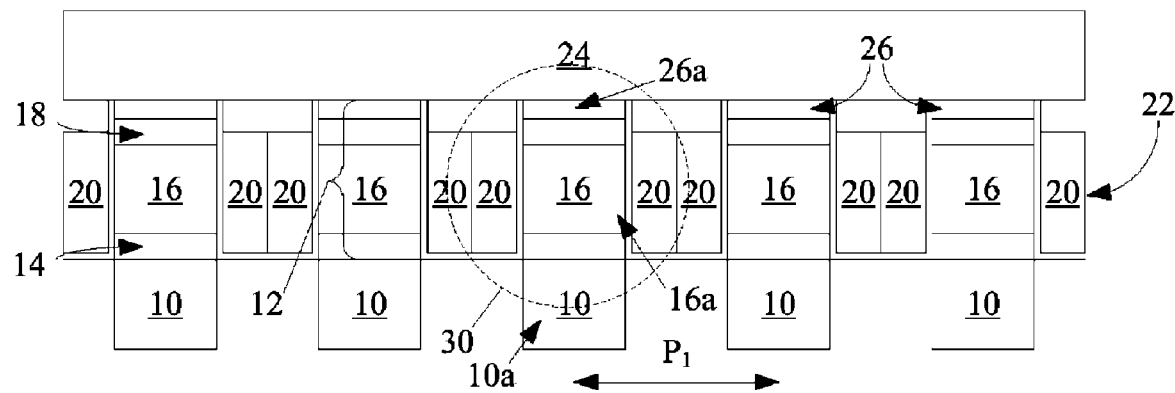
FIGS. 4a and 4c are cross-sectional views, from different angles, of a memory cells formed according to an alternative embodiment of the present invention.

Turning to FIG. 4a, in a preferred embodiment of Petti et al. a plurality of substantially parallel data lines 10 is formed. Semiconductor pillars 12 are formed, each above one of the data lines 10. Each pillar 12 includes heavily doped regions 14 and 18 which serve as drain and source regions, and a lightly doped region 16 which serves as a channel region. A gate electrode 20 surrounds each pillar 12.

Figure 4B:
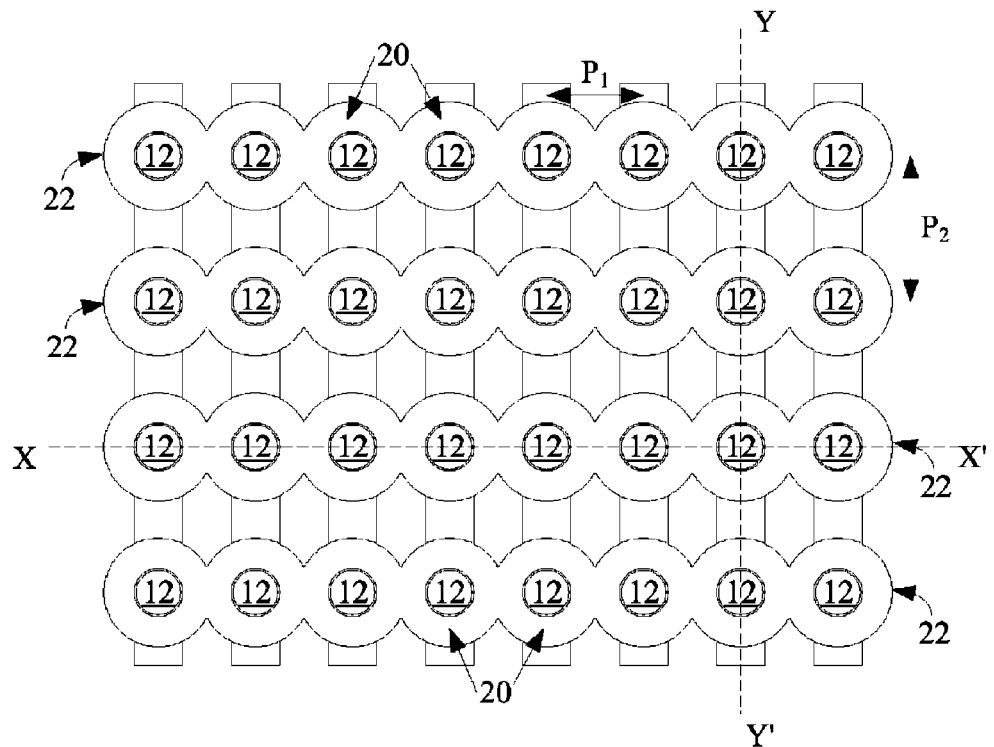
FIG. 4b is a plan view of these memory cells.

FIG. 4b shows the cells of FIG. 4a viewed from above. In a repeating pattern, pitch is the distance between a feature and the next occurrence of the same feature. For example, the pitch of pillars 12 is the distance between the center of one pillar and the center of the adjacent pillar. In one direction pillars 12 have a first pitch $P_1$, while in other direction, pillars 12 have a larger pitch $P_2$; for example $P_2$ may be 1.5 times larger than $P_1$. (Feature size is the width of the smallest feature or gap formed by photolithography in a device. Stated another way, pitch $P_1$ may be double the feature size, while pitch $P_2$ is three times the feature size.) In the direction having the smaller pitch $P_1$, shown in FIG. 4a, the gate electrodes 20 of adjacent memory cells merge, forming a single select line 22. In the direction having larger pitch $P_2$, gate electrodes 20 of adjacent cells do not merge, and adjacent select lines 22 are isolated. FIG. 4a shows the structure in cross-section along line X-X' of FIG. 2b, while FIG. 4c shows the structure in cross-section along line Y-Y' of FIG. 4b.

Figure 4C:
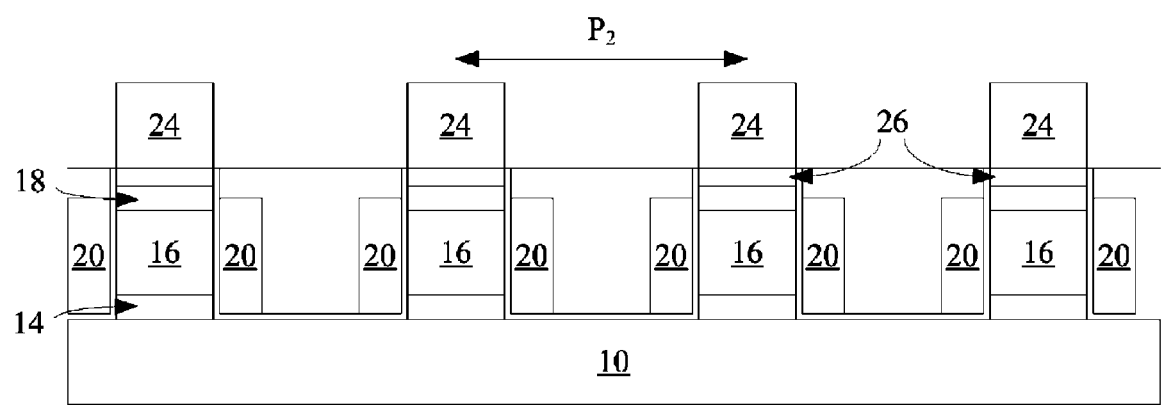

Referring to FIG. 4a and 4c, reference lines 24, preferably perpendicular to data lines 10, are formed above the pillars 12, such that each pillar 12 is vertically disposed between one of the data lines 10 and one of the reference lines 24. A resistance-switching memory element 26 is formed in each memory cell between source region 18 and reference line 24, for example. Alternatively, resistance-switching memory element 26 can be formed between drain region 14 and data line 10. In preferred embodiments of the present invention, resistance-switching element 26 comprises a layer of $(Ni_xCo_y)O$.

Figure 5:
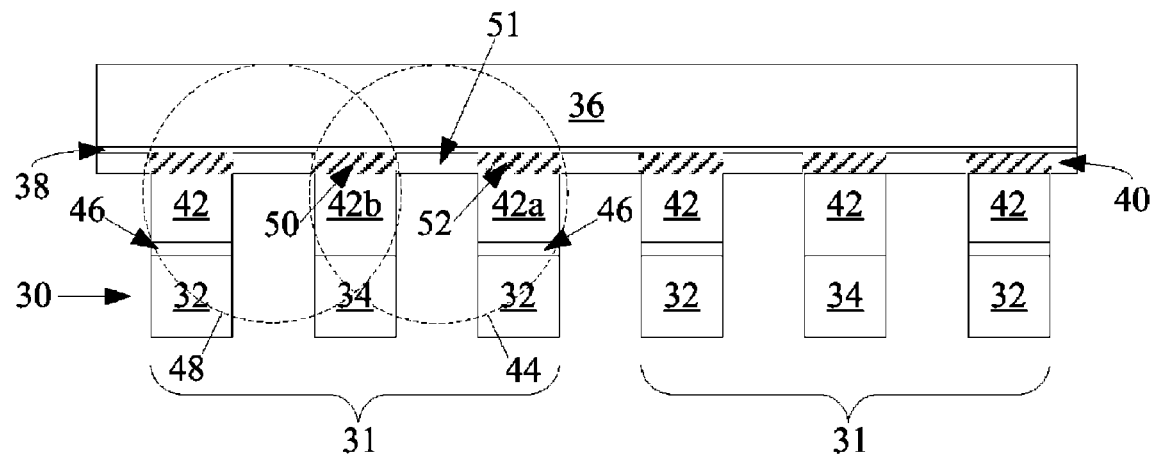
FIG. 5 is a cross-sectional view of memory cells formed according to another alternative embodiment of the present invention.

FIG. 5 illustrates another embodiment of Petti et al. This embodiment similarly includes memory cells in a TFT array, each having a transistor and a reversible resistance-switching memory element in series, but has a different structure. Substantially parallel rails 30 (shown in cross section, extending out of the page) include a plurality of line sets 31, each line set 31 consisting of two data lines 32 and one reference line 34, reference line 34 immediately adjacent to and between the two data lines 32. Above the rails 30 and preferably extending perpendicular to them, are substantially parallel select lines 36. Select lines 36 are coextensive with gate dielectric layer 38 and channel layer 40. The memory level includes pillars 42, each pillar 42 vertically disposed between one of the channel layers 40 and one of the data lines 32 or one of the reference lines 34. Transistors are formed comprising adjacent pillars along the same select line. Transistor 44 includes channel region 51 between source region 50 and drain region 52. One pillar 42a includes resistance-switching element 46, while the other pillar 42b does not. In this embodiment, adjacent transistors share a reference line; for example transistor 48 shares a reference line 34 with transistor 44. No transistor exists between adjacent data lines 32. In a preferred embodiment of the present invention, resistance-switching element 46 comprises a layer of $(Ni_xCo_y)O$.

Figure 6:
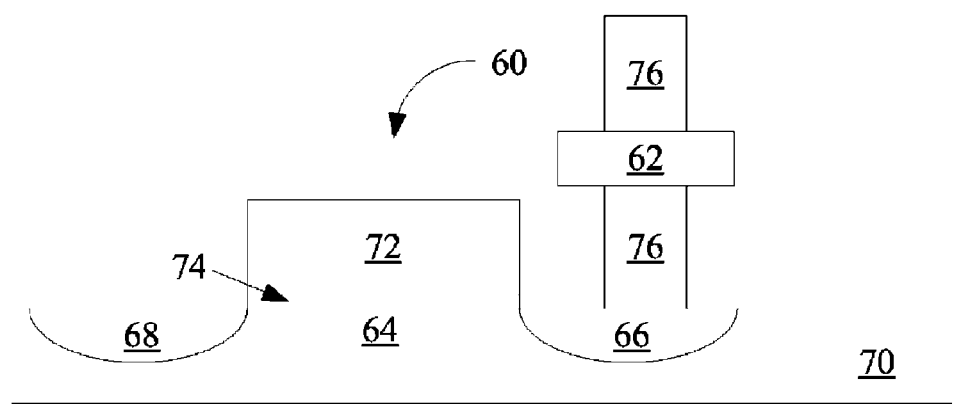
FIG. 6 is a cross-sectional view of memory cells formed according to yet another alternative embodiment of the present invention.

FIG. 6 illustrates still another embodiment, in which a transistor 60 is formed in series with a resistance-switching element 62. Resistance-switching element 62 comprises a layer of $(Ni_xCo_y)O$, and transistor 60 is formed having its channel region 64 and source and drain regions 66 and 68 in the monocrystalline semiconductor substrate 70, such as a silicon wafer. Conductive vias 76 electrically connect resistance-switching element 62 to source or drain region 68, and other connection as required.

These embodiments are provided as examples; others can be envisioned and fall within the scope of the invention.

In any of these memory cells, the layer of $(Ni_xCo_y)O$ can be formed by a variety of methods. In some embodiments, $(Ni_xCo_y)O$ is formed by wet chemical deposition of solutions containing nickel and cobalt, followed by calcination to drive off solvents. For example, solutions of $Co(NO_3)_2.H_2O$ and $Ni(NO_3)_2.H_2O$ are mixed in water or glycerine, then spin coated onto an appropriate substrate. Heating in air at 350 degrees C. for ten minutes evaporates the solvents, leaving a $(Ni_xCo_y)O$ film having a thickness of about 250 angstroms. Other methods may be used instead to form $(Ni_xCo_y)O$ layer 118.

Metal oxides and nitrides are often formed by reactive sputtering. To form $(Ni_xCo_y)O$ by this method, nickel and cobalt may be included in a single sputtering target in their desired proportions. For example, suppose the desired oxide is $(Ni_{0.75}Co_{0.25})O$. An alloy target having sputter material that is 75 at % nickel and 25 at % cobalt will provide these atoms in the desired proportion, and can be sputtered as usual by argon and $O_2$. Alternatively, separate nickel and cobalt targets can be employed in the chamber simultaneously, and the proportion of sputtering from each controlled by applying appropriate bias powers to the nickel and cobalt plasmas, respectively, or by other known means.

To form a layer of $(Ni_xCo_y)O$ where x or y is very small, the minority metal can be introduced by ion implantation or diffusion. For example, to form an oxide layer having a high proportion of nickel and a low proportion of cobalt, a layer of nickel oxide can be formed by any conventional method, then implanted with cobalt to the desired concentration. Similarly, to form an oxide layer having a high proportion of cobalt and a low proportion of nickel, for example, a layer of cobalt oxide can be formed by any conventional method and a thin layer of nickel oxide deposited above, below, or within the cobalt oxide layer (by atomic layer deposition, for example.) Subsequent thermal processing will cause the nickel to diffuse into the cobalt oxide layer.

As the actual switching mechanism is unclear, it is similarly unclear if the entire layer of $(Ni_xCo_y)O$ changes resistivity (layer 118 in FIG. 2, for example) or if switching only occurs in a filament through this layer. Either mechanism would fall within the scope of the invention, however.

The memory cell of Herner et al., U.S. patent application Ser. No. 10/955,549, "Nonvolatile Memory Cell Without a Dielectric Antifuse Having High- and Low-Impedance States," filed Sep. 29, 2004, hereinafter the '549 application and hereby incorporated by reference, describes a memory cell including a diode formed of polycrystalline silicon (or polysilicon). The polysilicon of the diode is formed in a high-resistivity state and can be converted to a low-resistivity state. The data state of the cell is effectively stored in the resistivity state of the polysilicon.

As described in Herner et al., U.S. patent application Ser. No. 11/148,530, "Nonvolatile Memory Cell Operating by Increasing Order in Polycrystalline Semiconductor Material" filed Jun. 8, 2005, hereinafter the '530 application and hereby incorporated by reference, it is believed that when amorphous silicon is crystallized adjacent to certain suicides, the resulting polysilicon may be more highly ordered, with fewer crystal defects, and thus more conductive than silicon crystallized with no adjacent silicide. It is believed that an adjacent layer of, for example, titanium silicide may have a lattice spacing and orientation which will provide a crystallization template for the silicon as it crystallizes, allowing it to crystallize with relatively few defects. In short, deposited silicon crystallized with no adjacent layer of titanium silicide will be relatively high in defects and high-resistivity as formed, while deposited silicon crystallized adjacent to a layer of titanium silicide will be lower in defects and low-resistivity as formed. High-defect, high-resistivity polysilicon can have its order increased by programming, converting it to low-resistivity polysilicon; these two states can correspond to data states and can be the basis of a memory cell. Low-defect polysilicon is low-resistivity as formed, and thus cannot the basis of a memory cell using this mechanism.

In the memory to be described, a memory cell will pair a resistivity-switching layer of $(Ni_xCo_y)O$ with a polysilicon diode. The resistivity-switching metal oxide or nitride layer will store the data state; thus there is no need for the polysilicon of the diode to store this state as well, or for the large voltage required to convert it to a low-resistivity state. In the memory to be described, then, it may be preferred that the polysilicon of the polysilicon diode be formed in a low-resistivity state, with an adjacent silicide.

A detailed example will be given describing formation of a first memory level of memory cells like those shown in FIG. 2, formed according to a preferred embodiment of the present invention. Additional details that may prove useful in forming this memory cell can be found in the '452, '995, and '549 applications; in Herner et al., U.S. Pat. No. 6,952,030, "High-Density Three-Dimensional Memory Cell"; and in Herner et al., U.S. patent application Ser. No. 11/148,530, "Nonvolatile Memory Cell Operating by Increasing Order in Polycrystalline Semiconductor Material," filed Jun. 8, 2005, all assigned to the assignee of the present invention and hereby incorporated by reference. To avoid obscuring the invention not all of the detail from these applications and patents will be included, but it will be understood that no teaching is intended to be excluded.

In this and subsequent examples, for clarity many details, including steps, materials, and process conditions, will be included. It will be understood that this example is non-limiting, and that these details can be modified, omitted, or augmented while the results fall within the scope of the invention.

Example

Fabrication

Figure 7A:
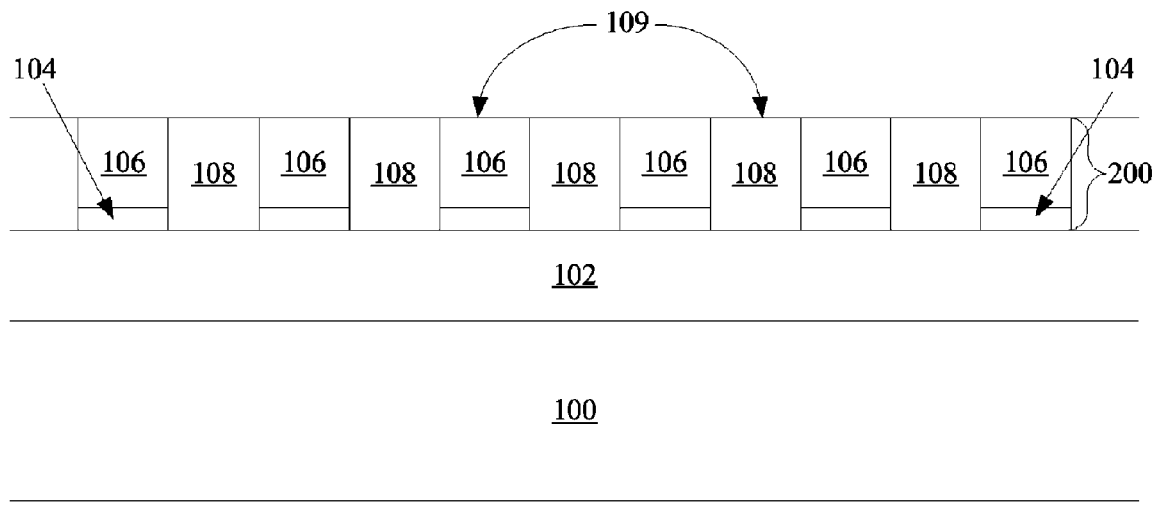
FIGS. 7a-7c are cross-sectional views illustrating stages in formation of a first memory level of memory cells according an embodiment of the present invention.

Turning to FIG. 7a, formation of the memory begins with a substrate 100. This substrate 100 can be any semiconducting substrate as known in the art, such as monocrystalline silicon, IV-IV compounds like silicon-germanium or silicon-germanium-carbon, III-V compounds, II-VII compounds, epitaxial layers over such substrates, or any other semiconducting material. The substrate may include integrated circuits fabricated therein.

An insulating layer 102 is formed over substrate 100. The insulating layer 102 can be silicon oxide, silicon nitride, high-dielectric film, Si—C—O—H film, or any other suitable insulating material.

The first conductors 200 are formed over the substrate 100 and insulator 102. An adhesion layer 104 may be included between the insulating layer 102 and the conducting layer 106 to help the conducting layer 106 adhere. A preferred material for the adhesion layer 104 is titanium nitride, though other materials may be used, or this layer may be omitted. Adhesion layer 104 can be deposited by any conventional method, for example by sputtering.

The next layer to be deposited is conducting layer 106. Conducting layer 106 can comprise any conducting material known in the art, such as doped semiconductor, metals such as tungsten, or metal alloys or compounds.

Once all the layers that will form the conductor rails have been deposited, the layers will be patterned and etched using any suitable masking and etching process to form substantially parallel, substantially coplanar conductors 200, shown in FIG. 7a in cross-section. In one embodiment, photoresist is deposited, patterned by photolithography and the layers etched, and then the photoresist removed, using standard process techniques such as "ashing" in an oxygen-containing plasma, and strip of remaining polymers formed during etch in a conventional liquid solvent such as those formulated by EKC.

Next a dielectric material 108 is deposited over and between conductor rails 200. Dielectric material 108 can be any known electrically insulating material, such as silicon oxide, silicon nitride, or silicon oxynitride. In a preferred embodiment, silicon oxide is used as dielectric material 108. The silicon oxide can be deposited using any known process, such as chemical vapor deposition (CVD), or, for example, high-density plasma CVD (HDPCVD).

Finally, excess dielectric material 108 on top of conductor rails 200 is removed, exposing the tops of conductor rails 200 separated by dielectric material 108, and leaving a substantially planar surface 109. The resulting structure is shown in FIG. 7a. This removal of dielectric overfill to form planar surface 109 can be performed by any process known in the art, such as etchback or chemical mechanical polishing (CMP). For example, the etchback techniques described in Raghuram et al., U.S. application Ser. No. 10/883,417, "Nonselective Unpatterned Etchback to Expose Buried Patterned Features," filed Jun. 30, 2004 and hereby incorporated by reference in its entirety, can advantageously be used. Alternatively, conductor rails can be formed by a Damascene process, in which oxide is deposited, trenches are etched in the oxide, then the trenches are filled with conductive material and overfill removed to create the conductor rails.

Figure 7B:
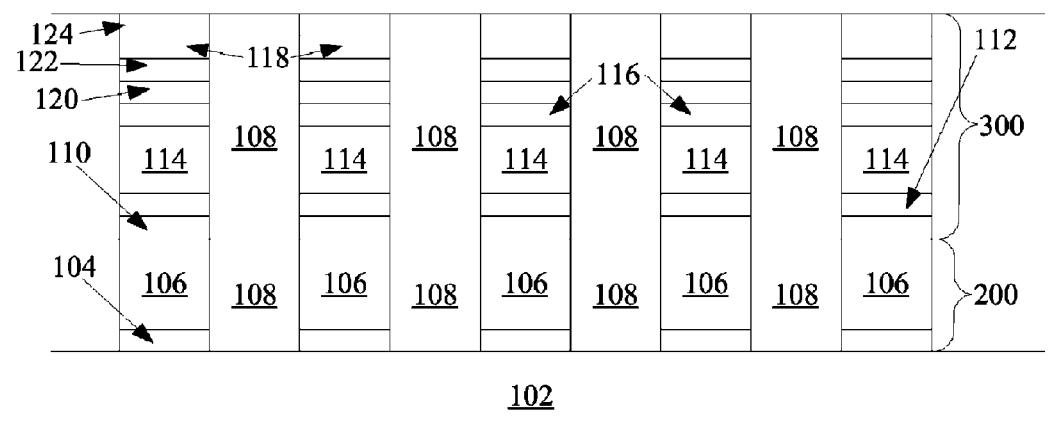

Next, turning to FIG. 7b, vertical pillars will be formed above completed conductor rails 200. (To save space substrate 100 is omitted in FIG. 7b and subsequent figures; its presence will be assumed.) Preferably a barrier layer 110 is deposited as the first layer after planarization of the conductor rails. Any suitable material can be used in the barrier layer, including tungsten nitride, tantalum nitride, titanium nitride, or combinations of these materials. In a preferred embodiment, titanium nitride is used as the barrier layer. Where the barrier layer 110 is titanium nitride, it can be deposited in the same manner as the adhesion layer described earlier.

Next semiconductor material that will be patterned into pillars is deposited. Any suitable semiconductor material or semiconductor alloy can be used. Silicon is preferred.

The term junction diode is used herein to refer to a semiconductor device with the property of non-ohmic conduction, having two terminal electrodes, and made of semiconducting material which is p-type at one electrode and n-type at the other. In preferred embodiments, the semiconductor pillar comprises a junction diode, the junction diode comprising a bottom heavily doped region of a first conductivity type and a top heavily doped region of a second conductivity type. The middle region, between the top and bottom regions, is an intrinsic or lightly doped region of either the first or second conductivity type.

In this example, bottom heavily doped region 112 is heavily doped n-type silicon. In a most preferred embodiment, heavily doped region 112 is deposited and doped with an n-type dopant such as phosphorus by any conventional method, preferably by in situ doping. This layer is preferably between about 200 and about 800 angstroms.

Next the silicon that will form the remainder of the diode is deposited by any method known in the art. In a preferred embodiment top heavily doped p-type region 116 will be formed by ion implantation. The thickness to be deposited in this step, then, will be the final desired thickness of intrinsic region 114 plus the desired thickness of top heavily doped region 116 after implantation. In the finished device, intrinsic region 114 is preferably between about 600 and about 2000 angstroms, for example about 1600 angstroms. Heavily doped p-type region 116 is between about 100 and about 1000 angstroms, preferably about 400 angstroms. (Some thickness, for example about 200 angstroms, of layer 116 will be consumed during silicide formation in a later step; thus the thickness of layer 116 may be selected to allow for this anticipated loss.) The thickness to be deposited undoped in this step, then, is between about 700 and about 3000 angstrom, preferably about 2000 angstroms.

Top heavily doped regions 116 are formed at this point by ion implantation with a p-type dopant, for example boron or $BF_2$. The diode described herein has a bottom n-type region and a top p-type region. If preferred, the conductivity types could be reversed.

When deposited by conventional methods, silicon regions 112, 114, and 116 will be amorphous at this point, and will be crystallized in a later step. As described earlier and in the '530 application, if these layers are crystallized adjacent to a layer of a silicide, for example titanium silicide, the resulting polysilicon will be low in defects and relatively low-resistivity, providing a diode that will provide relatively high current without first requiring application of a large programming voltage.

In preferred embodiments, the next layer deposited is layer 120 of titanium, which may be between about 30 and about 200 angstroms thick, preferably about 100 angstroms thick. Capping this is layer 122 of titanium nitride, which may be about 100 angstroms thick. In a later step an anneal, for example a rapid thermal anneal will be performed. This anneal will cause titanium layer 120 to react with the silicon of layer 116 to form titanium silicide (not shown) and will crystallize silicon layers 112, 114, and 116. During crystallization the silicon will be adjacent to a layer of titanium silicide, causing the resulting polysilicon to be low-resistivity. In alternative embodiments, layers 120 and 122 can be omitted.

A layer 118 of $Ni_xCo_y)O$, where x+y=1 and neither x nor y is 0, is formed on layer 122. In preferred embodiments the value of y is between about 0.01 and about 0.99; preferably between 0.05 and about 0.65, or between about 0.70 and about 0.95. More preferably the value of y is between about 0.10 and about 0.50 or between about 0.75 and about 0.95. Layer 118 is preferably between about 50 and about 300 angstroms thick, preferably about 200 angstroms thick. In preferred embodiments $(Ni_xCo_y)O$ layer 118 is formed by mixing solutions of $Co(NO_3)_2 \cdot H_2O$ and $Ni(NO_3)_2 \cdot H_2O$ in water or glycerine, then spin coating the mixture onto an appropriate substrate. Heating in air at 350 degrees C. for ten minutes evaporates the solvents, leaving a $(Ni_xCo_y)O$ film having a thickness of about 250 angstroms. The proportions of nickel and cobalt in solution can be varied to produce the desired proportion in the resulting oxide. Thickness of the $(Ni_xCo_y)O$ layer can be varied by conventional means, for example by varying the speed of spin coating.

Finally in preferred embodiments barrier layer 124 is deposited on $(Ni_xCo_y)O$ layer 118. Layer 124 is preferably titanium nitride, though some other appropriate conductive barrier material may be used instead. An upcoming CMP step will be performed on layer 124, so it is preferably relatively thick, about 800 angstroms.

Returning to FIG. 7b, at this stage layers 124, 118, 122, and 120, which will make up the resistance-switching state-change element, and silicon regions 116, 114, and 112, which will form the diode, will be patterned and etched to form pillars 300. Pillars 300 should have about the same pitch and about the same width as conductors 200 below, such that each pillar 300 is formed on top of a conductor 200. Some misalignment can be tolerated.

Pillars 300 can be formed using any suitable masking and etching process. The stack to be etched is relatively tall and includes materials which require the use of different etchants. Preferably, then, photoresist is deposited, patterned using standard photolithography techniques, then titanium nitride layer 124, $Ni_xCo_y)O$ layer 118, titanium nitride layer 122, and titanium layer 120 are etched. An advantageous method to etch transition metal oxides, such as those of many preferred materials for resistivity-switching layer 118, is described in Raghuram et al., U.S. patent application Ser. No. 11/179,423, "Method of Plasma Etching Transition Metals and Their Compounds," filed Jul. 11, 2005 and hereby incorporated by reference. These etched layers can then act as a hard mask during etch of the remaining layers.

The photolithography techniques described in Chen, U.S. application Ser. No. 10/728,436, "Photomask Features with Interior Nonprinting Window Using Alternating Phase Shifting," filed Dec. 5, 2003; or Chen, U.S. application Ser. No. 10/815,312, Photomask Features with Chromeless Nonprinting Phase Shifting Window," filed Apr. 1, 2004, both owned by the assignee of the present invention and hereby incorporated by reference, can advantageously be used to perform any photolithography step used in formation of a memory array according to the present invention.

Dielectric material 108 is deposited over and between pillars 300, filling the gaps between them. Dielectric material 108 can be any known electrically insulating material, such as silicon oxide, silicon nitride, or silicon oxynitride. In a preferred embodiment, silicon dioxide is used as the insulating material. The silicon dioxide can be deposited using any known process, such as CVD or HDPCVD.

Next the dielectric material on top of the pillars 300 is removed, exposing the tops of pillars 300 separated by dielectric material 108, and leaving a substantially planar surface. This removal of dielectric overfill and planarization can be performed by any process known in the art, such as CMP or etchback. For example, the etchback techniques described in Raghuram et al. can be used. The resulting structure is shown in FIG. 7b.

In this example, layers 124, 118, 122, and 120 were patterned in a single patterning step with silicon regions 112 and 114 and 116, followed by a multi-step etch. In some embodiments, however, it may be desirable to form the diode and the state-change element in separate patterning steps to reduce etch height and to avoid possible contamination by having $(Ni_xCo_y)O$ and metal barrier layers exposed in a chamber devoted to semiconductor etch. In this process (not shown), silicon regions 112 and 114 are deposited, patterned and etched to form pillars. Dielectric fill is deposited to fill gaps between the pillars, and a CMP step removes overfill and exposes the tops of the pillars at a substantially planar surface.

Top heavily doped regions 116 are formed by ion implantation. Titanium layer 120, titanium nitride layer 122, ($Ni_xCo_y$)O layer 118, and titanium layer 124 are deposited on this planar surface, then patterned and etched in a separate step to form short pillars aligned with the diode pillars below. Some misalignment may be tolerated. Dielectric fill is deposited between the short pillars, and a CMP step removes overfill and exposes the tops of the pillars.

In other alternative embodiments, barrier layer 122, ($Ni_xCo_y$)O layer 118, and barrier layer 124 can be formed before (and therefore beneath) diode layers 112, 114, and 116, and may be patterned in the same or in a separate patterning step. In this case, the first layer of top conductors above the pillars will be a titanium layer capped with titanium nitride (not shown). During a later anneal this titanium will react with the silicon at the top of the diode to form titanium suicide, providing a crystallization template to form a low-defect polycrystalline diode.

Figure 7C:
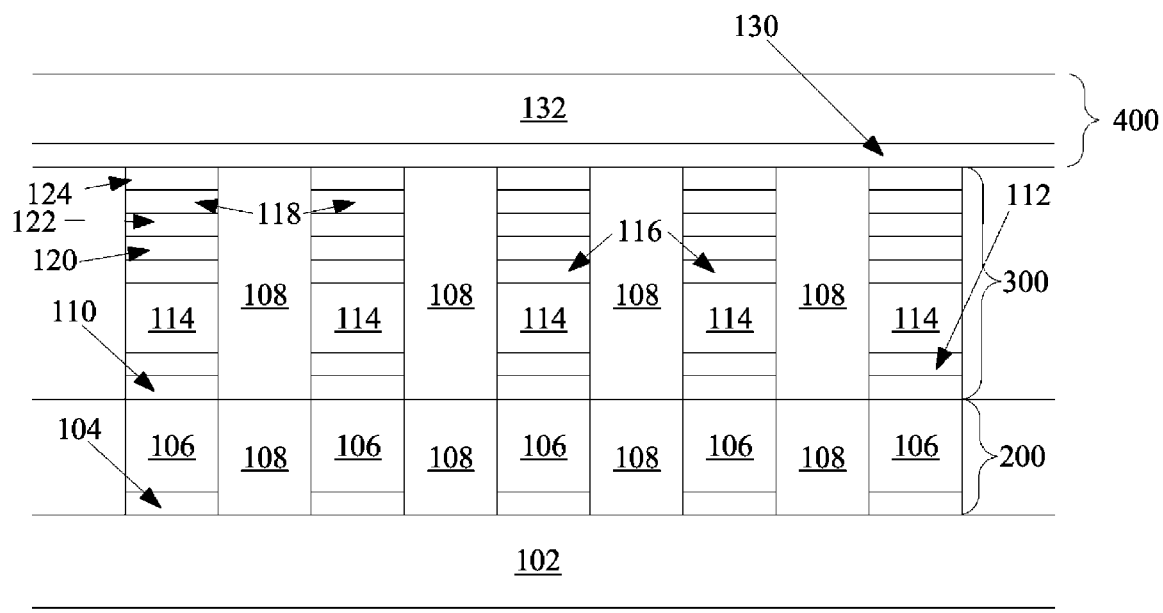

Turning to FIG. 7c, after formation of pillars 300 is complete, a conductive material or stack is deposited to form the top conductors 400. In a preferred embodiment, titanium nitride barrier layer 130 is deposited next, followed by tungsten layer 132. Top conductors 400 can be patterned and etched as described earlier. In this example in each cell the diode (of layers 112, 114, and 116) and a state-change element (comprising resistance-switching layer 118) have been formed in series between top conductor 400 and bottom conductor 200. Overlying second conductors 400 will preferably extend in a different direction from first conductors 200, preferably substantially perpendicular to them. The resulting structure, shown in FIG. 7c, is a bottom or first level of memory cells.

Additional memory levels can be formed above this first memory level. In some embodiments, conductors can be shared between memory levels; i.e. top conductor 400 would serve as the bottom conductor of the next memory level. In other embodiments, an interlevel dielectric is formed above the first memory level of FIG. 7c, its surface planarized, and construction of a second memory level begins on this planarized interlevel dielectric, with no shared conductors.

Example

Switching

In the embodiment just described, the set transition, switching the ($Ni_xCo_y$)O from higher resistivity to lower resistivity, may be most readily achieved by applying forward bias across the diode, while the reset transition, switching the ($Ni_xCo_y$)O layer from lower resistivity to higher resistivity, may be most readily achieved by applying reverse bias across the diode.

For example, referring to FIGS. 2 and 7c, the memory cells are formed with ($Ni_xCo_y$)O layer 118 of each memory cell in a relatively high-resistivity state. In preferred embodiments, in its initial state, when a read voltage of about 2 volts is applied across the memory cell, a current of about $10^{-8}$ amps may flow between top conductor 400 and bottom conductor 200. After application of a set pulse having a voltage of about 6 volts or less, preferably between about 4 and about 6 volts, more preferably between about 4 and about 6 volts, ($Ni_xCo_y$)O layer 118 switches to a lower-resistivity set state. In the set state, when a read voltage of about 2 volts is applied across the memory cell, a current of about $10^{-6}$ amps may flow between top conductor 400 and bottom conductor 200. The difference in current allows the difference in resistivity state to be readily detected, and corresponds to a data state of the memory cell. These currents are examples only, and will vary with the precise configuration of the cell and of the array.

To return the cell to a higher-resistivity state, a reset pulse is applied across the memory cell in reverse bias; for example a voltage of between about −8 and about −11 volts is applied, preferably between about −9 volts and about −10 volts.

Subsequent switches from high-to-low resistivity may be achieved using the same voltage required to effect the initial switch—i.e. no additional forming pulse is required—or may be achieved with a somewhat lower set voltage.

It will be understood by those skilled in the art that the voltages and currents supplied herein are examples only, and will vary with many details of fabrication, including the thickness of ($Ni_xCo_y$)O layer 118, the height of the diode, etc.

Example ($Ni_xCo_y$)O with Transistor in Monosilicon Substrate

FIG. 6 shows an example of a memory cell comprising a transistor 60 and a resistance-switching element 62 which comprises a layer of ($Ni_xCo_y$)O. The transistor 60 can be formed in a conventional manner. For example, a dielectric material such as silicon dioxide is deposited or grown on substrate 70, then a conductive material such as heavily doped silicon deposited on the dielectric material. These layers are patterned and etched to form control gate 72 and gate dielectric 74. Source and drain regions 66 and 68 are formed by conventional methods, such as doping by ion implantation. Vias 76 and resistance-switching element 62 are formed subsequently by conventional means. Substrate 70 may be any suitable substrate, for example a monocrystalline silicon wafer.

Resistance-switching element 62 comprises a ($Ni_xCo_y$)O layer. Optional conductive barrier layers such as titanium nitride or some other suitable material may be included in resistance-switching element 62. Electrical contact to this memory cell can be provided by conventional means.

A monolithic three dimensional memory array is one in which multiple memory levels are formed above a single substrate, such as a wafer, with no intervening substrates. The layers forming one memory level are deposited or grown directly over the layers of an existing level or levels. In contrast, stacked memories have been constructed by forming memory levels on separate substrates and adhering the memory levels atop each other, as in Leedy, U.S. Pat. No. 5,915,167, "Three dimensional structure memory." The substrates may be thinned or removed from the memory levels before bonding, but as the memory levels are initially formed over separate substrates, such memories are not true monolithic three dimensional memory arrays.

A monolithic three dimensional memory array formed above a substrate comprises at least a first memory level formed at a first height above the substrate and a second memory level formed at a second height different from the first height. Three, four, eight, or indeed any number of memory levels can be formed above the substrate in such a multilevel array.

Detailed methods of fabrication have been described herein, but any other methods that form the same structures can be used while the results fall within the scope of the invention.

The foregoing detailed description has described only a few of the many forms that this invention can take. For this reason, this detailed description is intended by way of illustration, and not by way of limitation. It is only the following claims, including all equivalents, which are intended to define the scope of this invention.

What is claimed is:

1. A memory cell comprising:
   a resistance-switching element comprising a layer of $(Ni_xCo_y)O$, wherein x+y=1 and neither x nor y is 0, wherein the layer of $(Ni_xCo_y)O$ is capable of having at least two resistances;
   wherein the memory cell has a first logic state that corresponds to a first resistance of the $(Ni_xCo_y)O$ layer and a second logic state that corresponds to a second resistance of the $(Ni_xCo_y)O$ layer, wherein the first resistance differs from the second resistance.

2. The memory cell of claim 1 further comprising a diode, a first conductor, and a second conductor, the diode and the resistance-switching element disposed between the first conductor and the second conductor.

3. The memory cell of claim 2 wherein the second conductor is above the first conductor relative to a substrate, the first and second conductors above the substrate.

4. The memory cell of claim 3 wherein the diode is a vertically oriented junction diode.

5. The memory cell of claim 4 wherein the junction diode is a p-i-n diode.

6. The memory cell of claim 5 wherein the junction diode is formed of silicon, germanium, or an alloy of silicon and/or germanium.

7. The memory cell of claim 6 wherein the junction diode is formed of polycrystalline semiconductor material.

8. The memory cell of claim 3 wherein the substrate is monocrystalline silicon.

9. The memory cell of claim 1 wherein the value of y is between about 0.05 and about 0.65, or between about 0.70 and about 0.95.

10. The memory cell of claim 9 wherein the value of y is between about 0.10 and about 0.50 or between about 0.75 and about 0.95.

11. The memory cell of claim 1 further comprising a transistor arranged electrically in series with the resistance-switching element.

12. The memory cell of claim 11 wherein the transistor is a field effect transistor.

13. The memory cell of claim 12 wherein the field effect transistor comprises a channel region, the channel region formed in monocrystalline silicon.

14. The memory cell of claim 12 wherein the field effect transistor comprises a channel region, the channel region formed in polycrystalline semiconductor material.

15. The memory cell of claim 11 wherein the transistor is a bipolar junction transistor.

16. The memory cell of claim 15 wherein the bipolar junction transistor comprises collector, emitter, and base regions, wherein at least one of the collector, emitter, and base regions is formed of monocrystalline silicon.

17. The memory cell of claim 15 wherein the bipolar junction transistor comprises collector, emitter, and base regions, wherein the collector, emitter, and base regions are all formed of polycrystalline semiconductor material.

18. The memory cell of claim 1 wherein, during normal operation of the cell, the layer of $(Ni_xCo_y)O$ is in a high-resistance state or a low-resistance state.

19. The memory cell of claim 18 wherein the difference in resistance between the high-resistance state and the low-resistance state is at least a factor of five.

20. The memory cell of claim 18 wherein the difference in resistance between the high-resistance state and the low-resistance state is at least a factor of ten.

21. The memory cell of claim 18 wherein the layer of $(Ni_xCo_y)O$ is switched from the high-resistance state to the low-resistance state by application of a set pulse.

22. The memory cell of claim 21 wherein, when the cell is initially formed, the layer of $(Ni_xCo_y)O$ is in the high-resistance state, and wherein for the first switch to the low-resistance state the set pulse has a voltage of about 8 volts or less.

23. The memory cell of claim 22 wherein, when the cell is initially formed, the layer of $(Ni_xCo_y)O$ is in the high-resistance state, and wherein for the first switch to the low-resistance state the set pulse has a voltage of about 6 volts or less.

24. The memory cell of claim 18 wherein the resistance-switching element is switched from the low-resistance state to the high-resistance state by application of a reset pulse.

25. The memory cell of claim 1 wherein the cell is a nonvolatile, rewriteable memory cell.

26. A first memory level above a substrate comprising:
   a plurality of first substantially parallel, substantially coplanar conductors extending in a first direction;
   a plurality of second substantially parallel, substantially coplanar conductors extending in a second direction different from the first direction, the second conductors above the first conductors;
   a plurality of first pillars, each first pillar vertically disposed between one of the first conductors and one of the second conductors; and
   a first plurality of memory cells, each first memory cell comprising a portion of one of the first conductors, one of the first pillars, a portion of one of the second conductors, and a resistance-switching element, the resistance-switching element comprising a layer of nickel-cobalt oxide, wherein the layer of nickel-cobalt oxide is capable of having at least two resistances;
   wherein the memory cell has a first logic state that corresponds to a first resistance of the nickel-cobalt oxide layer and a second logic state that corresponds to a second resistance of the nickel-cobalt oxide layer, wherein the first resistance differs from the second resistance.

27. The first memory level of claim 26 wherein the nickel-cobalt oxide is $(Ni_xCo_y)O$, where x+y=1 and neither x nor y is zero.

28. The first memory level of claim 27 wherein the value of y is between about 0.05 and about 0.65, or between about 0.70 and about 0.95.

29. The first memory level of claim 28 wherein the value of y is between about 0.10 and about 0.50 or between about 0.75 and about 0.95.

30. The first memory level of claim 26 wherein each first pillar comprises a vertically oriented diode.

31. The first memory level of claim 30 wherein the diode of each first pillar is a junction diode.

32. The first memory level of claim 31 wherein the diode of each first pillar is a p-i-n diode.

33. The first memory level of claim 31 wherein the diode of each first pillar is formed of silicon, germanium, or an alloy of silicon and/or germanium.

34. The first memory level of claim 31 wherein the diode of each first pillar is formed of polycrystalline semiconductor material.

35. The first memory level of claim 26 wherein the substrate comprises monocrystalline silicon.

36. The first memory level of claim 26 wherein at least a second memory level is monolithically formed above the first memory level.

37. A monolithic three dimensional memory array comprising:
   a) a first memory level monolithically formed above a substrate, the first memory level comprising a plurality of first memory cells, each first memory cell comprising a layer of resistivity-switching nickel-cobalt oxide, wherein the layer of resistivity-switching nickel-cobalt oxide is capable of having a least two resistances; and
   b) a second memory level monolithically formed above the first memory level;
   wherein the memory cell has a first logic state that corresponds to a first resistance of the resistivity-switching nickel-cobalt oxide layer and a second logic state that corresponds to a second resistance of the resistivity-switching nickel-cobalt oxide layer, wherein the first resistance differs from the second resistance.

38. The monolithic three dimensional memory array of claim 37 wherein the nickel-cobalt oxide is $(Ni_xCo_y)O$, where $x+y=1$ and neither x nor y is 0.

39. The monolithic three dimensional memory array of claim 38 wherein the value of y is between about 0.05 and about 0.65, or between about 0.70 and about 0.95.

40. The monolithic three dimensional memory array of claim 39 wherein the value of y is between about 0.10 and about 0.50 or between about 0.75 and about 0.95.

41. The monolithic three dimensional memory array of claim 37 wherein the first memory level further comprises:
   a plurality of first substantially parallel, substantially coplanar conductors extending in a first direction;
   a plurality of second substantially parallel, substantially coplanar conductors extending in a second direction different from the first direction, the second conductors above the first conductors; and
   a plurality of first vertically oriented diodes, each diode disposed between one of the first conductors and one of the second conductors,
   wherein each first memory cell comprises a portion of one of the first conductors, a portion of one of the second conductors, and one of the first diodes, and
   wherein, in each first memory cell, the diode and the layer of resistivity-switching nickel-cobalt oxide are arranged electrically in series between one of the first conductors and one of the second conductors.

42. The monolithic three dimensional memory array of claim 39 wherein the diodes are vertically oriented junction diodes.

43. The monolithic three dimensional memory array of claim 40 wherein the diodes are vertically oriented p-i-n diodes.

44. The monolithic three dimensional memory array of claim 39 wherein the diodes comprise polysilicon, polygermanium, or a polycrystalline alloy of silicon and/or germanium.

45. The monolithic three dimensional memory array of claim 37 wherein each first memory cell further comprises a transistor, the transistor and the layer of resistivity-switching nickel-cobalt oxide arranged electrically in series.

* * * * *